United States Patent
Ogata et al.

(10) Patent No.: US 10,638,234 B2
(45) Date of Patent: Apr. 28, 2020

(54) SPEAKER SYSTEM

(71) Applicant: DAI-ICHI SEIKO CO., LTD., Kyoto-shi, Kyoto (JP)

(72) Inventors: Kenji Ogata, Ogori (JP); Yoshifumi Ikeda, Ogori (JP); Shogo Kurogi, Ogori (JP); Yoshiyuki Watanabe, Takasaki (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 16/090,801

(22) PCT Filed: Apr. 12, 2017

(86) PCT No.: PCT/JP2017/014968
§ 371 (c)(1),
(2) Date: Oct. 2, 2018

(87) PCT Pub. No.: WO2017/179616
PCT Pub. Date: Oct. 19, 2017

(65) Prior Publication Data
US 2019/0124451 A1 Apr. 25, 2019

(30) Foreign Application Priority Data
Apr. 15, 2016 (JP) .................. 2016-082490

(51) Int. Cl.
*H04R 17/00* (2006.01)
*H04R 3/00* (2006.01)
(Continued)

(52) U.S. Cl.
CPC .......... *H04R 17/00* (2013.01); *H01L 41/042* (2013.01); *H01L 41/083* (2013.01); *H04R 1/005* (2013.01);
(Continued)

(58) Field of Classification Search
CPC .......... H04R 17/00; H04R 1/005; H04R 1/24; H04R 19/02; H04R 2499/13; H04R 3/00;
(Continued)

(56) References Cited

U.S. PATENT DOCUMENTS

| 3,947,708 | A | * | 3/1976 | Fulenwider | ............ | H04R 1/005 |
| | | | | | | 310/330 |
| 5,157,730 | A | * | 10/1992 | Liu | ......................... | H04R 1/005 |
| | | | | | | 310/317 |

(Continued)

FOREIGN PATENT DOCUMENTS

| JP | S58-104598 A | 6/1983 |
| JP | S58-202697 A | 11/1983 |

(Continued)

OTHER PUBLICATIONS

International Search Report and Written Opinion (International Patent Application No. PCT/JP2017/014968); dated May 23, 2017; Includes English Translation of ISR.

(Continued)

*Primary Examiner* — Gerald Gauthier
(74) *Attorney, Agent, or Firm* — Howard & Howard Attorneys PLLC

(57) ABSTRACT

A piezoelectric driver (10) includes n piezoelectric layers (3A to 3D) (where n is an integer equal to or greater than 2) that are stacked, with electrode layers (4B to 4D) each interposed between any adjacent piezoelectric layers, and with electrode layers (4A and 4E) further formed underneath the lowermost piezoelectric layer (3A) and on top of the uppermost piezoelectric layer (3D), and the piezoelectric driver (10) is bent and displaced in the direction in which the piezoelectric layers are stacked. A signal converter (11) converts an n-bit digital signal (IS) into n bits of a bit string data signal (BS) comprising of bit data indicating whether a drive voltage to be applied to each of the piezoelectric layers (Continued)

IS

| DECIMAL NUMBER | BINARY NUMBER |
|---|---|
| 4 | 0100 |
| 2 | 0010 |
| 1 | 0001 |
| 0 | 0000 |
| −1 | 1111 |
| −2 | 1110 |
| −4 | 1100 |

BS

| 3D | 3C | 3B | 3A |
|---|---|---|---|
| 1 | 1 | 1 | 1 |
| 0 | 0 | 1 | 1 |
| 0 | 0 | 0 | 1 |
| 0 | 0 | 0 | 0 |
| 0 | 0 | 0 | −1 |
| 0 | 0 | −1 | −1 |
| −1 | −1 | −1 | −1 |

(3A to 3D) via the electrode layers (4A to 4B) is on or off. An output device (12) outputs, in accordance with values of the individual bits in the bit string data signal (BS) provided through conversion performed by the signal converter (11), drive voltages to be applied to the individual piezoelectric layers (3A to 3D).

8 Claims, 20 Drawing Sheets

(51) Int. Cl.
    *H01L 41/04*     (2006.01)
    *H01L 41/083*     (2006.01)
    *H04R 1/00*     (2006.01)
    *H04R 1/24*     (2006.01)
    *H04R 19/02*     (2006.01)

(52) U.S. Cl.
    CPC ................ *H04R 1/24* (2013.01); *H04R 3/00* (2013.01); *H04R 19/02* (2013.01); *H04R 2499/13* (2013.01)

(58) Field of Classification Search
    CPC ....... H04R 5/02; H01L 41/083; H01L 41/042; G06F 17/00; H03F 3/00; H03F 3/217
    USPC .......... 307/80; 310/324, 330, 331, 333, 348, 310/364, 366; 367/165; 381/111, 190; 399/88; 600/25; 702/188
    See application file for complete search history.

(56) References Cited

U.S. PATENT DOCUMENTS

| | | | | |
|---|---|---|---|---|
| 5,159,226 A * | 10/1992 | Montgomery | ........ | B06B 1/0611 310/333 |
| 5,166,908 A * | 11/1992 | Montgomery | ........ | E21B 47/124 310/328 |
| 5,347,587 A * | 9/1994 | Takahashi | ............. | H03F 3/2175 381/111 |
| 6,492,761 B1 * | 12/2002 | Perez | .................... | H04R 1/005 310/324 |
| 9,525,955 B2 * | 12/2016 | Uehara | .................... | H04R 3/12 |
| 9,571,926 B2 * | 2/2017 | Jianxiong | ................ | H04R 3/00 |
| 9,641,937 B2 * | 5/2017 | Kuromoto | ............... | H03F 3/185 |
| 9,681,231 B2 * | 6/2017 | Yasuda | .................. | H03H 15/00 |
| 9,693,136 B2 * | 6/2017 | Okamura | ............... | H04R 1/005 |
| 9,793,868 B2 * | 10/2017 | Yasuda | .................. | H04R 1/005 |
| 2007/0205700 A1 * | 9/2007 | Okamura | ........... | F02M 51/0603 310/364 |
| 2009/0110217 A1 * | 4/2009 | Yasuda | .................. | H03H 15/00 381/120 |
| 2011/0160883 A1 | 6/2011 | Yasuda et al. | | |
| 2012/0053393 A1 * | 3/2012 | Kaltenbacher | ......... | H04R 17/00 600/25 |
| 2012/0212061 A1 * | 8/2012 | Takatsuka | ............. | H01L 41/044 307/80 |
| 2012/0256521 A1 * | 10/2012 | Nishikubo | ............ | B06B 1/0611 310/311 |
| 2013/0045023 A1 * | 2/2013 | Kosaka | .................. | G03G 15/80 399/88 |
| 2013/0066594 A1 * | 3/2013 | Ludlow | .................. | H02N 2/186 702/188 |
| 2013/0156231 A1 | 6/2013 | Yasuda et al. | | |
| 2013/0334933 A1 * | 12/2013 | Ukai | ..................... | F04B 43/046 310/366 |
| 2013/0342078 A1 * | 12/2013 | Beresnev | ............ | H01L 41/0926 310/331 |
| 2014/0368088 A1 * | 12/2014 | Takahashi | ................ | H03H 9/21 310/348 |
| 2015/0310024 A1 | 10/2015 | Yasuda et al. | | |
| 2016/0205471 A1 | 7/2016 | Yasuda et al. | | |
| 2016/0309274 A1 * | 10/2016 | Ma | .......................... | H03M 3/04 |
| 2018/0213332 A1 * | 7/2018 | Kaplan | ................ | H01L 41/0926 |
| 2019/0124451 A1 * | 4/2019 | Ogata | .................... | H04R 1/005 |

FOREIGN PATENT DOCUMENTS

| | | |
|---|---|---|
| JP | H2-141096 A | 5/1990 |
| JP | H5-013118 | 4/1993 |
| JP | 2005-303937 A | 10/2005 |
| JP | 2011-211725 A | 10/2011 |
| JP | 2015-029313 A | 2/2015 |

OTHER PUBLICATIONS

Notice of Reasons for Refusal (JP Patent Application No. 2018-512046); dated Sep. 30, 2019; Includes English Translation; 8 pages.

* cited by examiner

| DECIMAL NUMBER | BINARY NUMBER |
|---|---|
| $2^3$ | (+)1000 |
| $2^2$ | (+)0100 |
| $2^1$ | (+)0010 |
| $2^0$ | (+)0001 |
| 0 | 0000 |
| $-2^0$ | (−)0001 |
| −21 | (−)0010 |
| $-2^2$ | (−)0100 |
| $-2^3$ | (−)1000 |

BS

| 3D | 3C | 3B | 3A |
|---|---|---|---|
| 1 | 1 | 1 | 1 |
| 0 | 1 | 1 | 1 |
| 0 | 0 | 1 | 1 |
| 0 | 0 | 0 | 1 |
| 0 | 0 | 0 | 0 |
| 0 | 0 | 0 | −1 |
| 0 | 0 | −1 | −1 |
| 0 | −1 | −1 | −1 |
| −1 | −1 | −1 | −1 |

FIG. 14

| IS | | | BS | | | |
|---|---|---|---|---|---|---|
| DECIMAL NUMBER | BINARY NUMBER | | 3D | 3C | 3B | 3A |
| 4 | 0100 | → | 1 | 1 | 1 | 1 |
| 3 | 0011 | → | 0 | 1 | 1 | 1 |
| 2 | 0010 | → | 0 | 0 | 1 | 1 |
| 1 | 0001 | → | 0 | 0 | 0 | 1 |
| 0 | 0000 | → | 0 | 0 | 0 | 0 |
| −1 | 1111 | → | 0 | 0 | 0 | −1 |
| −2 | 1110 | → | 0 | 0 | −1 | −1 |
| −3 | 1101 | → | 0 | −1 | −1 | −1 |
| −4 | 1100 | → | −1 | −1 | −1 | −1 |

| DECIMAL NUMBER | BINARY NUMBER |
|---|---|
| 4 | 0100 |
| 2 | 0010 |
| 1 | 0001 |
| 0 | 0000 |
| −1 | 1111 |
| −2 | 1110 |
| −4 | 1100 |

BS

| 3D | 3C | 3B | 3A |
|---|---|---|---|
| 1 | 1 | 1 | 1 |
| 0 | 0 | 1 | 1 |
| 0 | 0 | 0 | 1 |
| 0 | 0 | 0 | 0 |
| 0 | 0 | 0 | −1 |
| 0 | 0 | −1 | −1 |
| −1 | −1 | −1 | −1 |

SPEAKER SYSTEM

CROSS-REFERENCE TO RELATED APPLICATIONS

This application is a national phase application of International Patent Application No. PCT/JP2017/014968, filed Apr. 12, 2017, which claims priority to JP Patent Application No. 2016-082490, filed Apr. 15, 2016, the disclosures of which are hereby incorporated by reference in their entirety.

TECHNICAL FIELD

The present disclosure relates to a speaker system.

BACKGROUND ART

In general, loudness of a sound (sound pressure) produced by a sounding body is dependent on the displacement of a vibrating part, which is the sound source of the sounding body, under conditions in which the surface area of the vibrating part and the frequency are unchanged. Thus, conventionally, a typical method used for obtaining a desired sound pressure includes inputting an analog signal to the sounding body and vibrating the sounding body in accordance with the amplitude of the analog signal. Vibrating the sounding body with analog signals causes a lower S/N ratio under the influence of switching noise, sampling error, or the like. Thus with the objective of increasing the S/N ratio and broadening dynamic range, digital speakers are disclosed in which piezoelectric elements are directly driven in accordance with digital signals without involving conversion from digital signals to analog signals (see Patent Literatures 1 and 2, for example). In the piezoelectric speaker disclosed in Patent Literature 1, piezoelectric layered structures are arranged in parallel on a vibrating plate (a substrate), where the number of layers in each structure varies with the weight of the corresponding bit in bit string data. In the PCM acoustic converter disclosed in Patent Literature 2, piezoelectric layered structures are stacked in the layering direction, where the number of layers in each structure varies with the weight of the corresponding bit in the bit string data.

CITATION LIST

Patent Literature

Patent Literature 1: Unexamined Japanese Patent Application Kokai Publication No. H2-141096
Patent Literature 2: Examined Japanese Utility Model Application Publication No. H5-13118

SUMMARY OF INVENTION

Technical Problem

The piezoelectric speaker disclosed in Patent Literature 1 needs a space large enough to arrange as many piezoelectric layered structures in parallel on the vibrating plate (substrate) as the number of bit digits. The PCM acoustic converter disclosed in Patent Literature 2 includes piezoelectric layered structures stacked in series on the substrate, where the number of the structures corresponds to the number of bit digits. Therefore as the number of bit digits is increases, these speaker systems need a larger area or a greater height for installing piezoelectric elements, and thus such speaker systems suffer from difficulty in achieving a system having smaller size, lighter weight, and lower power consumption.

In consideration of the aforementioned circumstances, an objective of the present disclosure is to provide a speaker system that can achieve a system having much smaller size, lighter weight, and lower power consumption.

Solution to Problem

To achieve the above-described objective, a speaker system according to the present disclosure includes:

a piezoelectric driver in which n piezoelectric layers are stacked sandwiching electrode layers therebetween, for displacement by bending in a direction of stacking of the piezoelectric layers, n being an integer greater than or equal to 2, and electrode layers being further formed (i) underneath a lowermost piezoelectric layer of the piezoelectric layers and (ii) on top of an uppermost piezoelectric layer of the piezoelectric layers;

a signal converter for converting an n-bit digital signal into a bit string data signal of n-bits, each bit of the n bits indicating whether a drive voltage to be applied to a piezoelectric layer of the piezoelectric layers via the electrode layers is on or off; and an output device that outputs, in accordance with values of the bits in the bit string data signal converted by the signal converter, drive voltages to be applied to each of the piezoelectric layers.

In this case, when an absolute value in decimal form of the digital signal is 0, the signal converter may generate, as the bit string data signal, a signal of n-bit data indicating that a drive voltage is off;

when the absolute value in decimal form of the digital signal is $2^{n-1}$, the signal converter may generate, as the bit string data signal, a signal of n-bit data indicating that a drive voltage is on; and when the absolute value in decimal form of the digital signal is $2^{k-1}$, the signal converter may generate, as the bit string data signal, a signal made up of n-bit data being a combination of k-bit data indicating that a drive voltage is on and (n−k)-bit data indicating that a drive voltage is off, k being an integer satisfying $1 \leq k < n$.

The signal converter may:

detect any bit digit representing a value of 1 in the digital signal; and generate, as the bit string data signal, a signal in which a value of any bit lower than the detected bit digit indicates that a drive voltage is on and a value of any bit higher than the detected bit digit indicates that a drive voltage is off.

When an absolute value in decimal form of the digital signal is 0, the signal converter may generate, as the bit string data signal, a signal made up of n-bit data indicating that a drive voltage is off;

when the absolute value in decimal form of the digital signal is n, the signal converter may generate, as the bit string data signal, a signal made up of n-bit data indicating that a drive voltage is on; and assuming that m represents a value obtained by cumulatively adding a weight of any bit digit having a value of 1 in the absolute value in binary form of the digital signal, the signal converter may generate, as the bit string data signal, a signal made up of n-bit data being a combination of m-bit bit data indicating that a drive voltage is on and (n−m)-bit data indicating that a drive voltage is off, m being an integer satisfying $0 \leq m < n$.

The signal converter may obtain a number m in accordance with the weight of a bit digit having a value of 1 in the absolute value in binary form of the digital signal, and generate, as the bit string data signal, a signal in which values of m bits indicate that a drive voltage is on and values of (n−m) bits indicate that a drive voltage is off.

When the absolute value in decimal form of the digital signal is $2^{k-1}$, the signal converter may obtain a number m in accordance with the weight of a bit digit having a value of 1 in the absolute value in binary form of the digital signal, and generate, as the bit string data signal, a signal in which values of m bits indicate that a drive voltage is on and values of (n−m) bits indicate that a drive voltage is off, k being an integer satisfying $1 \leq k < n$.

The signal converter may include a setting part for setting, before the digital signal is input, a position of a bit indicating that a drive voltage is on and a position of a bit indicating that a drive voltage is off in the bit string data signal.

When a value in decimal form of the digital signal is negative, the output device may apply, to each of the piezoelectric layers, drive voltages with polarities opposite to the polarities for a positive value.

Advantageous Effects of Invention

According to the present disclosure, piezoelectric layers forming a stack of n layers are bent and displaced in the direction in which the piezoelectric layers are stacked, thus providing a bending displacement in accordance with the weight in decimal form of the n-bit digital signal, and thus a desired sound pressure can be produced. Accordingly, a sound corresponding to the n-bit digital signal can be produced without the need for arranging in parallel or stacking piezoelectric layered structures, each of which is formed by stacking layers depending on the corresponding bit digit. As a result, a speaker can be achieved that has much smaller size, lighter weight, and lower power consumption.

BRIEF DESCRIPTION OF DRAWINGS

FIG. 7 illustrates an example of bit string data signals provided through conversion by the signal converter;

FIG. 14 illustrates an example of bit string data signals provided through conversion by a signal converter in a speaker system according to Embodiment 2 of the present disclosure;

FIG. 17 illustrates an example of bit string data signals provided through conversion by a signal converter in the speaker system according to Embodiment 3 of the present disclosure;

DESCRIPTION OF EMBODIMENTS

Embodiments of the present disclosure are described in detail with reference to the drawings.

Embodiment 1

The following describes Embodiment 1 of the present disclosure.

Figure 1:
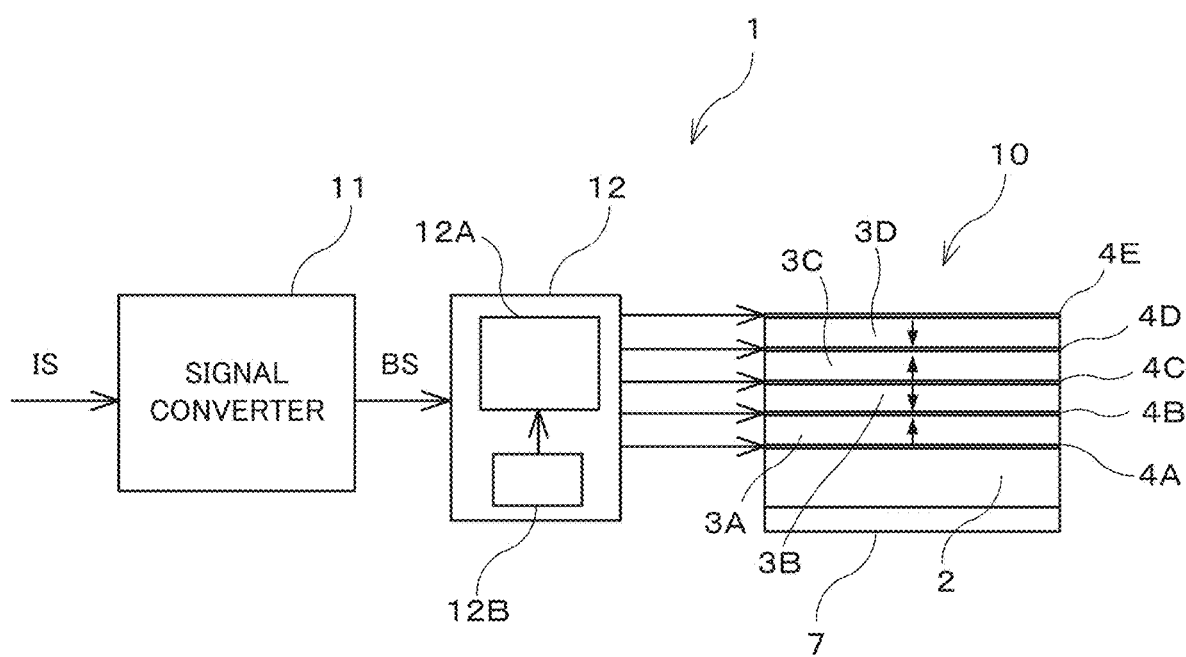
FIG. 1 is a block diagram illustrating a configuration of a speaker system according to Embodiment 1 of the present disclosure.

As illustrated in FIG. 1, a speaker system 1 according to the present embodiment includes a piezoelectric driver 10 that has piezoelectric layers 3A, 3B, 3C, and 3D made of, for example, lead zirconate titanate (PZT), a signal converter 11 that converts a 4-bit digital signal IS into four voltage signals (a bit string data signal BS), and an output device 12 that outputs, in accordance with the signal provided through conversion by the signal converter 11, voltage signals to be applied to the individual piezoelectric layers 3A to 3D.

In the piezoelectric driver 10, the piezoelectric layers 3A to 3D are stacked on a substrate 2 in this order by using a semiconductor manufacturing technology with electrode layers 4B, 4C, and 4D each interposed between adjacent piezoelectric layers. An electrode layer 4A is formed underneath the lowermost piezoelectric layer 3A, while an electrode layer 4E is formed on top of the uppermost piezoelectric layer 3D. The piezoelectric layer 3A is driven by a voltage across the electrode layers 4A and 4B, the piezoelectric layer 3B is driven by a voltage across the electrode layers 4B and 4C, the piezoelectric layer 3C is driven by a voltage across the electrode layers 4C and 4D, and the piezoelectric layer 3D is driven a voltage across the electrode layers 4D and 4E. The piezoelectric layers 3A, 3B, 3C, and 3D expand or contract, driven by voltages applied to the electrode layers 4A, 4B, 4C, 4D, and 4E. The substrate 2 is formed of a material (silicon, for example) that neither expands nor contracts when a voltage is applied.

Polarities of the piezoelectric layers 3A to 3D are indicated by the respective arrows. As indicated by these arrows, the piezoelectric layers 3A and 3C have upward polarities, while the piezoelectric layers 3B and 3D have downward polarities. Because the piezoelectric layers 3A to 3D are stacked with such polarity orientations, the piezoelectric layers 3A to 3D expand when voltage is applied so that the electrode layers 4B and 4D are at a high potential and the electrode layers 4A, 4C, 4E are at a low potential, while the piezoelectric layers 3A to 3D contract when reverse voltage is applied.

Figure 2A:
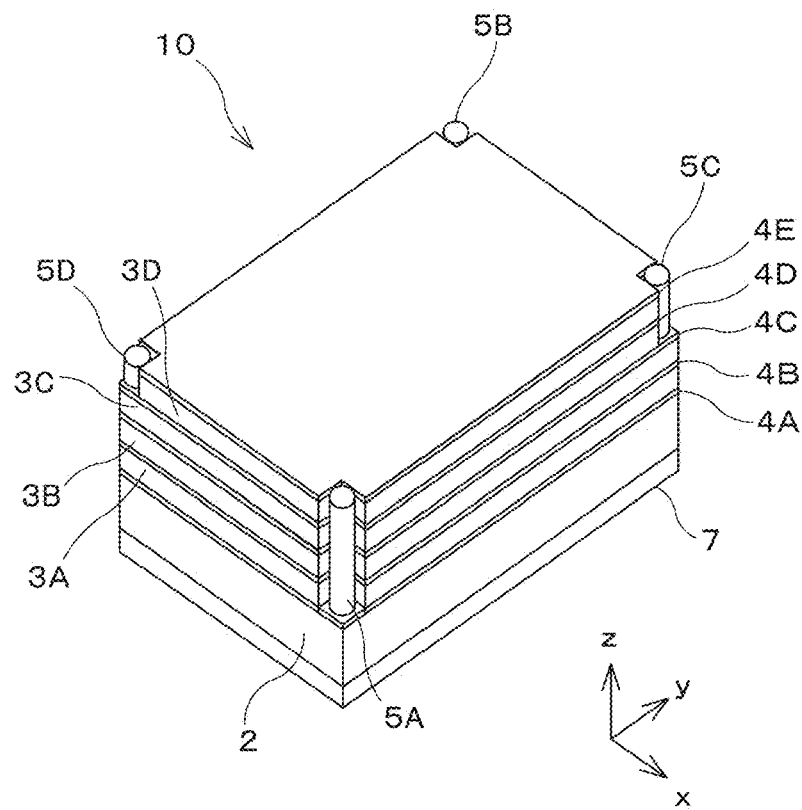
FIG. 2A is a perspective view of a piezoelectric driver seen from one direction.
Figure 2B:
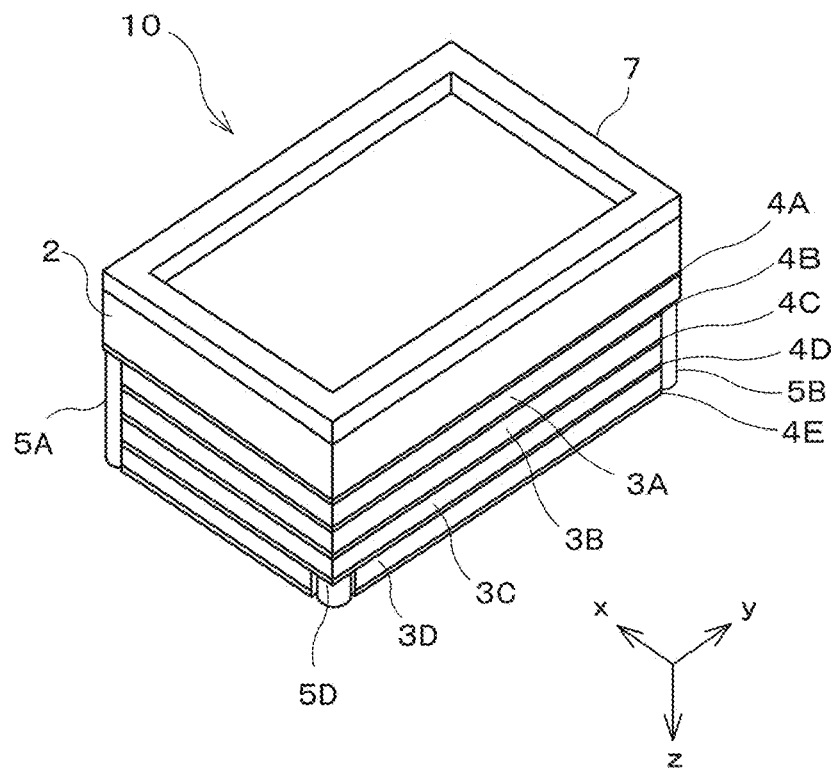
FIG. 2B is a perspective view of the piezoelectric driver seen from another direction.

As illustrated in FIGS. 2A and 2B, the individual piezoelectric layers 3A to 3D are flat rectangular plates of the same area, have a uniform thickness, and are identical. Therefore, these piezoelectric layers 3A to 3D will equally expand or contract when the same voltage is applied thereto. In the present embodiment, either a voltage of zero or a certain non-zero voltage (drive voltage) is applied to each of the piezoelectric layers 3A to 3D. The state in which a non-zero drive voltage is applied to the individual piezoelectric layers 3A to 3D is hereinafter called the on state, while the state in which the zero drive voltage is applied to the individual piezoelectric layers 3A to 3D is hereinafter called the off state.

Figure 3A:
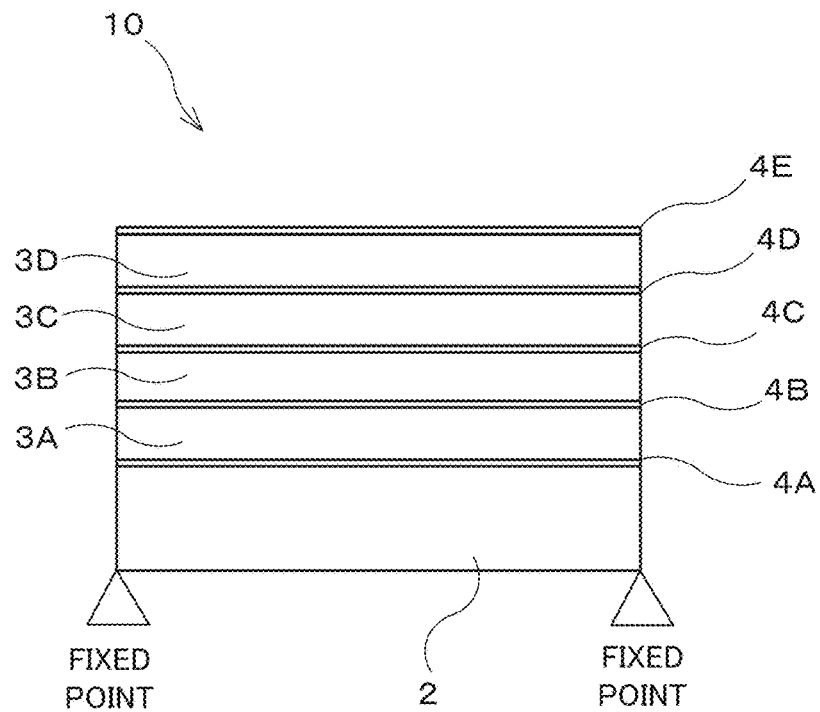
FIG. 3A is a diagram (part 1) illustrating a bending displacement in the piezoelectric driver seen in the x direction.
Figure 3B:
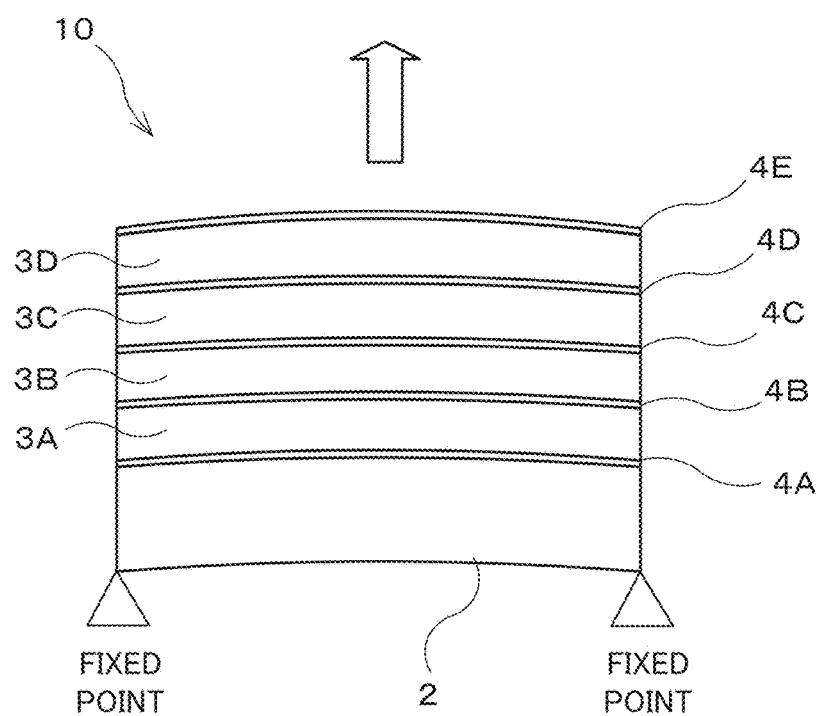
FIG. 3B is a diagram (part 2) illustrating a bending displacement in the piezoelectric driver seen in the x direction.

As described above, the substrate 2, which neither expands nor contracts even when a voltage is applied, is layered on the electrode layer 4A, which is formed on the piezoelectric layer 3A. Owing to such layering of the substrate 2, each of the piezoelectric layers 3A to 3D are two-point supported at both ends (secured with fixed points placed at both ends) as illustrated in FIG. 3A. Therefore, when the drive voltages applied to the individual piezoelectric layers 3A to 3D are changed from the off to on state, the piezoelectric driver 10 in the state illustrated in FIG. 3A is displaced as illustrated in FIG. 3B. Specifically, the piezoelectric driver 10 is displaced in the direction indicated by the arrow in FIG. 3B into the shape of an arc. In this manner, when a drive voltage is turned on, the piezoelectric driver 10 is bent and displaced in the arrow direction, that is, in the direction of stacking of the piezoelectric layers 3A to 3D (a bending displacement occurs). This bending displacement causes the piezoelectric driver 10 to produce a sound.

Figure 4A:
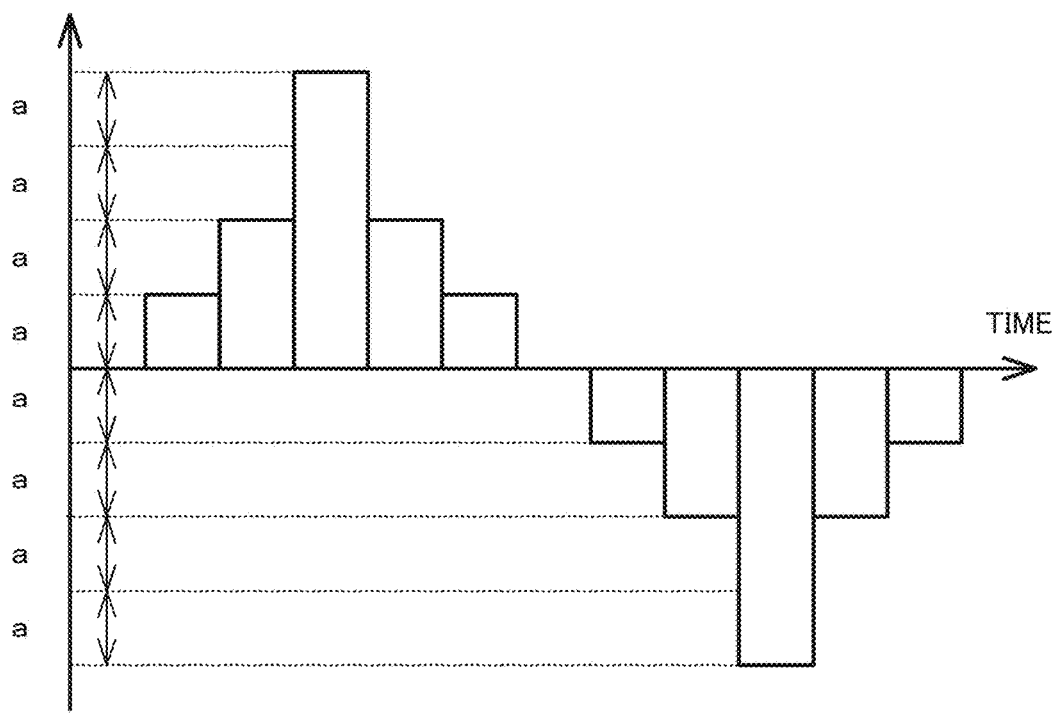
FIG. 4A is a graph (part 1) representing vibrations in the piezoelectric driver.
Figure 4B:
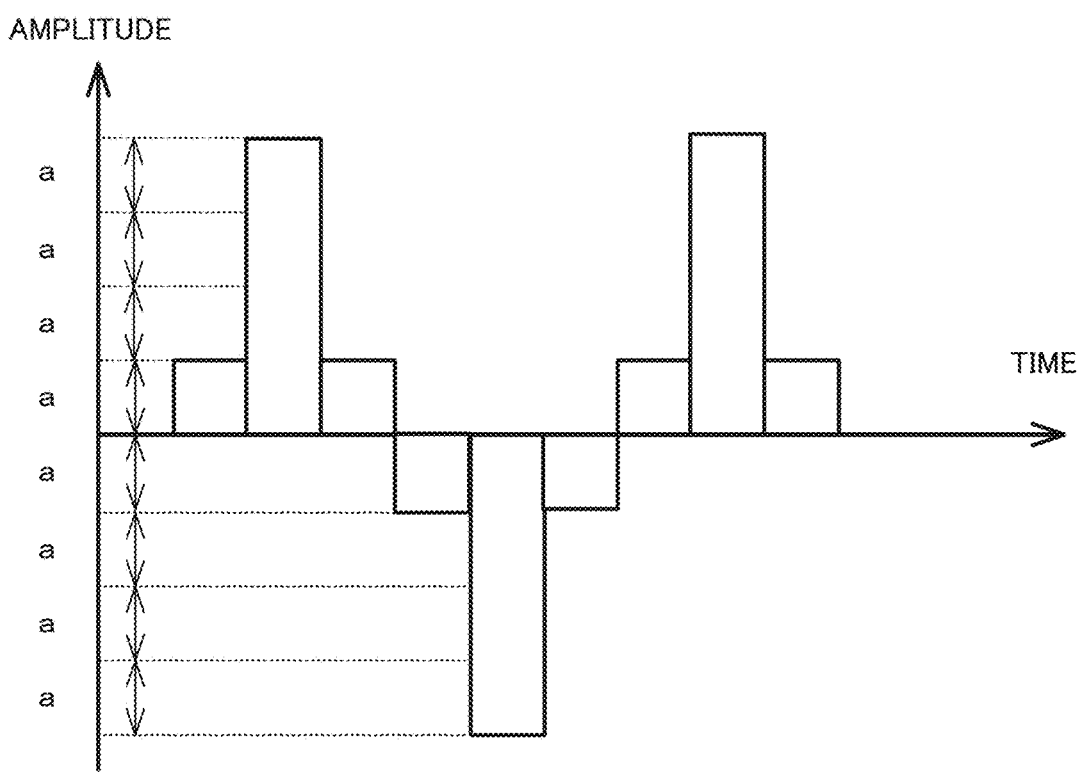
FIG. 4B is a graph (part 2) representing vibrations in the piezoelectric driver.

The amount by which each of the piezoelectric layers 3A to 3D is displaced when a drive voltage is changed from the off to on state is herein denoted by "a". The total amount of displacement of all the piezoelectric layers 3A to 3D is denoted by a, 2a, 3a, or 4a in the positive direction (for example, in the direction indicated by the arrow in FIG. 3B), or −a, −2a, −3a, or −4a in the negative direction (for example, in the direction opposite to that indicated by the arrow in FIG. 3B), depending on the number of piezoelectric layers whose drive voltages are turned on. As illustrated in FIGS. 4A and 4B, the piezoelectric layers 3A to 3D as a whole can be vibrated to produce a sound by intermittently switching between the on and off states of a drive voltage applied to each of the piezoelectric layers 3A to 3D to change the amount of displacement of each of the piezoelectric layers 3A to 3D.

To cause the piezoelectric driver 10 to produce a low-pitch sound, drive voltages applied to the piezoelectric layers 3A to 3D may be turned on or off with a frequency of the low-pitch sound (that is, with a longer cycle period) as illustrated by an example in FIG. 4A. To cause the piezoelectric driver 10 to produce a high-pitch sound, drive voltages applied to the piezoelectric layers 3A to 3D may be turned on or off with a frequency of the high-pitch sound (that is, with a shorter cycle period) as illustrated in FIG. 4B.

As depicted in FIGS. 2A and 2B, cylindrical bumps 5A, 5B, 5C and 5D are disposed at the four corners of the piezoelectric driver 10. The bump 5A is electrically connected to the electrode layer 4A, the bump 5B is electrically connected to the electrode layer 4B, the bump 5C is electrically connected to the electrode layer 4C, and the bump 5D is electrically connected to the electrode layer 4D. Voltage signals output by the output device 12 are applied to the electrode layers 4A to 4E via wiring, lead wires (such as bonding wires), the bumps 5A to 5D, and the like. The bumps 5A to 5D enable a voltage to be applied to any one of the electrode layers 4A to 4E.

As illustrated in FIG. 2B, a rubber member 7 is attached on the bottom face of the substrate 2 in the piezoelectric driver 10. The piezoelectric driver 10 is attached to another member via the rubber member 7, which is in the shape of a frame. As a result, vibration components transmitted from the piezoelectric driver 10 to the member can be decreased. The rubber member 7 is not always required in the piezoelectric driver 10. Thus, the piezoelectric driver 10 without the rubber member 7 may be attached to another member.

The piezoelectric driver 10 without the rubber member 7, for example, can be flip-chip mounted on the component side of a circuit board using the bumps 5A to 5D. To flip-chip mount this piezoelectric driver 10, the first step is preparing a circuit board with an opening formed on the component side, the opening being large enough not to prevent bending displacement of the piezoelectric driver 10. Next, the piezoelectric driver 10 is placed on the component side of the circuit board, with the electrode layer 4E facing the opening. The mounting is completed by soldering the bumps 5A to 5D in the piezoelectric driver 10 to electrodes disposed on the component side of the circuit board.

Figure 5:
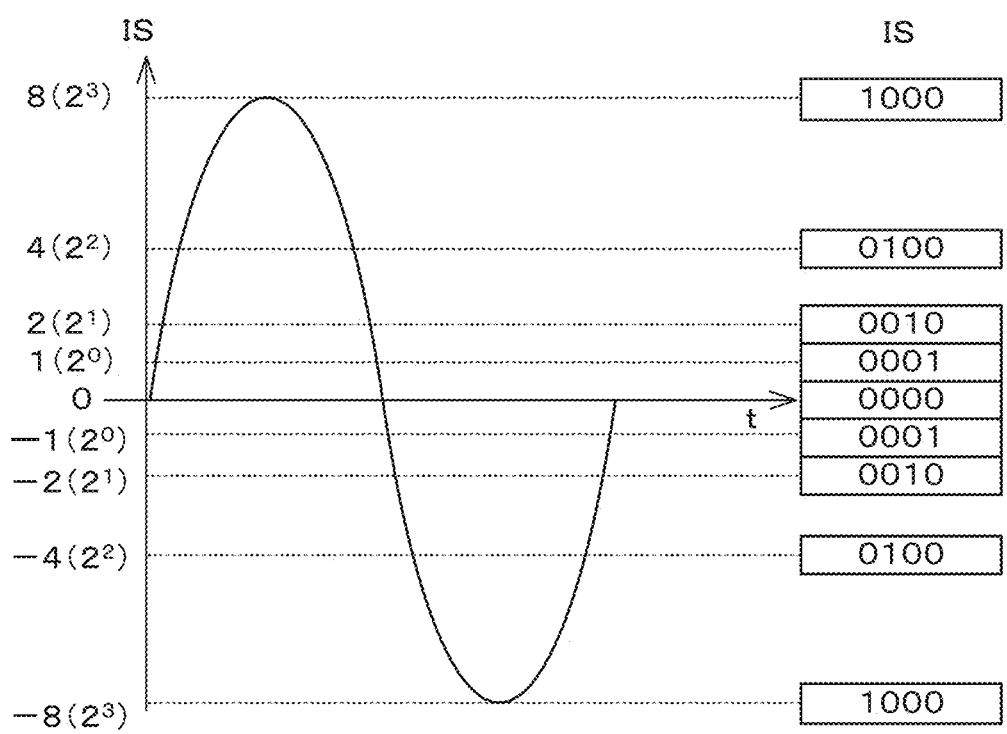
FIG. 5 is a diagram illustrating an example of input digital signals.

A 4-bit digital signal IS is inputted to the signal converter 11. The digital signal IS may be, for example, a pulse-code modulation (PCM) signal outputted from an A/D converter. As illustrated in FIG. 5, the 4-bit digital signal IS takes values, for example, ranging from −8 (−$2^3$) to +8 (+$2^3$) in decimal form. In the digital signal IS, the absolute value of ±8 is expressed as "1000" in binary form. Similarly, in the digital signal IS, the absolute value of ±4 is expressed as "0100" in binary form, the absolute value of ±2 as "0010" in binary form, the absolute value of ±1 as "0001" in binary form, and 0 as "0000" in binary form. When the piezoelectric driver 10 is caused to vibrate following the signal waveform drawn in FIG. 5, the piezoelectric driver 10 produces a sound based on the digital signal IS.

Note that, in the present embodiment, another 1-bit signal is input to the signal converter 11 for the information indicating whether the digital signal IS is positive or negative. The signal converter 11 determines whether the digital signal IS is positive or negative on the basis of the 1-bit signal.

The signal converter 11 converts the digital signal IS into a 4-bit bit string data signal BS indicating whether drive voltages to the individual piezoelectric layers 3A to 3D are to be on or off. The bit string data signal BS is made up of bit string data indicating whether drive voltages applied to the piezoelectric layers 3A to 3D via the electrode layers 4A to 4E are to be on or off.

Figure 6:
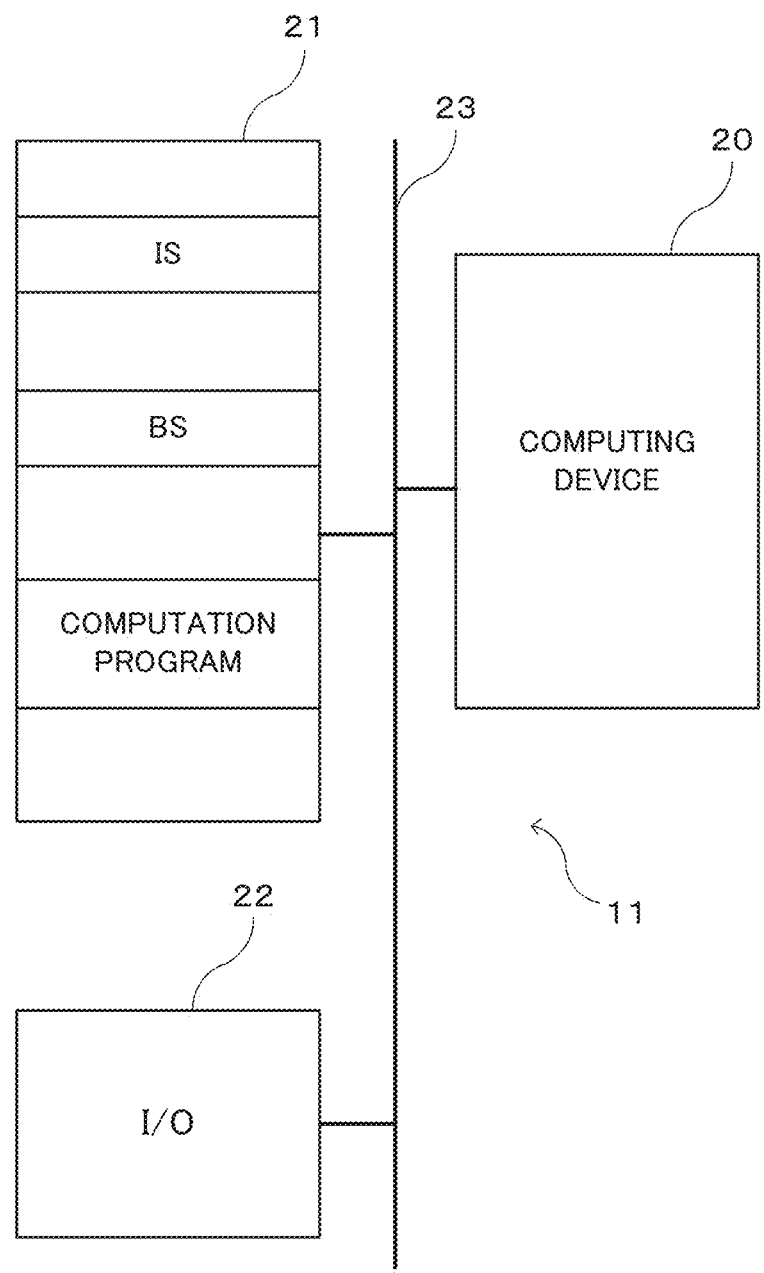
FIG. 6 is a block diagram illustrating a hardware configuration of a signal converter.

As illustrated in FIG. 6, the signal converter 11 includes, as hardware components, a computing device 20, a storage 21, an I/O device 22, and an internal bus 23. The computing device 20 is a processor that carries out a computation process by which the 4-bit digital signal IS is converted into the 4-bit bit string data signal BS.

The storage 21 stores a computation program to be executed by the computing device 20, a digital signal IS to be processed, and a bit string data signal BS. The computing device 20 carries out the aforementioned computation process by executing the computation program stored in the storage 21. The I/O device 22 inputs a digital signal IS, stores the inputted digital signal IS in the storage 21, and outputs, to the output device 12, the bit string data signal BS calculated by the computing device 20 and stored into the storage 21. The internal bus 23 communicatively connects the other components to each other.

The signal converter 11 converts a digital signal IS into a bit string data signal BS. For example, through this conversion, the digital signal IS representing +8 ($2^3$) in decimal form is turned into the bit string data signal BS representing (1111) in binary form, as illustrated in FIG. 7. This value indicates that all the drive voltages applied to the piezoelectric layers 3A to 3D are to be on.

The digital signal IS representing +4 ($2^2$) in decimal form is turned into the bit string data signal BS representing "0111" in binary form. This value indicates that all the drive voltages applied to the piezoelectric layers 3A to 3C are to be on.

The digital signal IS representing +2 ($2^1$) in decimal form is turned into the bit string data signal BS representing "0011" in binary form. This value indicates that all the drive voltages applied to the piezoelectric layers 3A and 3B are to be on.

The digital signal IS representing +1 ($2^0$) in decimal form is turned into the bit string data signal BS representing "0001" in binary form. This value indicates that the drive voltage applied to the piezoelectric layer 3A is to be on.

The digital signal IS representing 0 in decimal form is turned into the bit string data signal BS representing "0000" in binary form. This value indicates that all the drive voltages applied to the piezoelectric layers 3A to 3D are to be off.

A negative value represented by the digital signal IS is expressed as −1 in FIG. 7 because a drive voltage with reverse polarity is applied to any of the piezoelectric layers 3A to 3D.

In other words, as seen in FIG. 7, when the absolute value in decimal form of the digital signal IS is 0, the signal converter 11 generates a signal made up of n-bit data (n=4 in the present embodiment) indicating that drive voltages are off ("0000" in binary form), as the bit string data signal BS. When the absolute value in decimal form of the digital signal IS is $2^{n-1}$ (in the present embodiment, the absolute value is $2^{4-1}$), the signal converter 11 generates a signal made up of n-bit data (4-bit data in the present embodiment) indicating that drive voltages are on, as the bit string data signal BS.

Furthermore, when the absolute value in decimal form of the digital signal IS is $2^{k-1}$ (where k is an integer satisfying 1≤k<n) (in the present embodiment, the absolute value is $2^0$, $2^1$, or $2^2$), the signal converter 11 generates, as the bit string data signal BS, a signal made up of n-bit data as a combination of k-bit data indicating that a drive voltage is on and (n−k)-bit data indicating that a drive voltage is off.

More specifically, the signal converter 11 detects any bit digit representing a value of 1 in the digital signal IS, as shown in FIG. 7. Then, the signal converter 11 generates, as the bit string data signal BS, a signal in which a value of any bit lower than the detected bit digit indicates that a drive voltage is on and a value of any bit higher than the detected bit digit indicates that a drive voltage is off.

In accordance with values of the individual bits in the bit string data signal BS generated by the signal converter 11, the output device 12 outputs drive voltages to be applied to the individual piezoelectric layers 3A to 3D in the piezoelectric driver 10. Specifically, the output device 12 applies drive voltages to the piezoelectric layers 3A to 3D by separately outputting voltage signals to the individual electrode layers 4A to 4E. When drive voltages are applied, the piezoelectric layers 3A to 3D vibrate, thereby causing the piezoelectric driver 10 to produce a sound in accordance with the digital signal IS.

Figure 8:
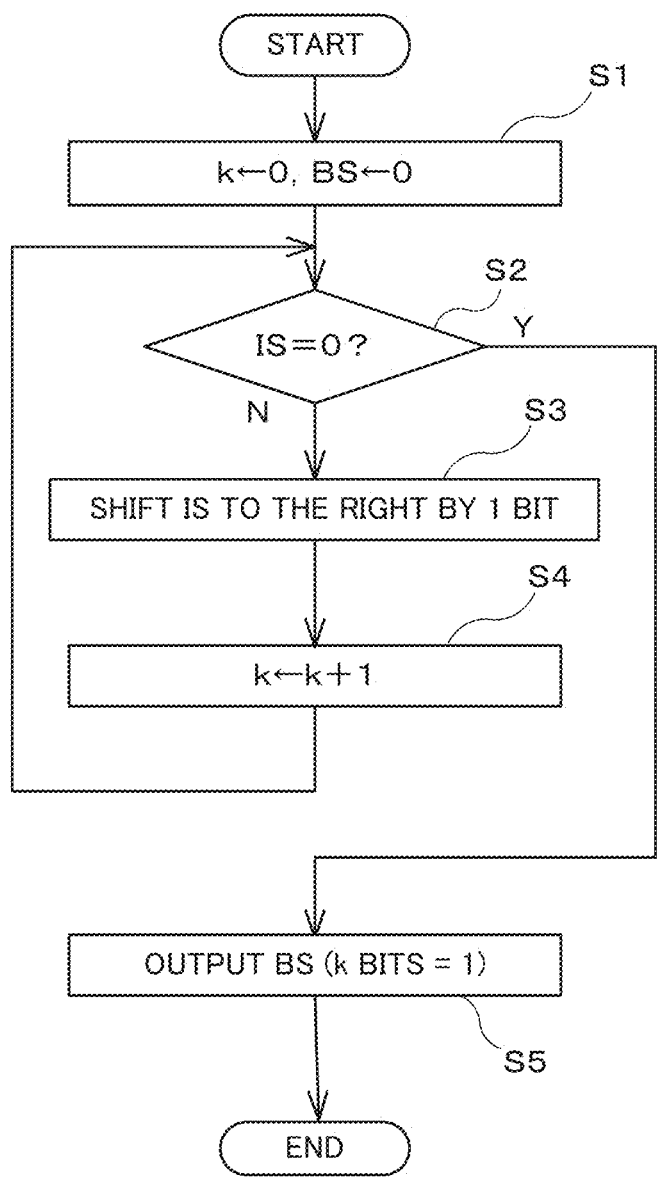
FIG. 8 is a flowchart of a signal conversion process carried out by the signal converter.

Operations of the signal converter 11 in the speaker system 1 according to the present embodiment are described below. As shown in FIG. 8, the computing device 20 firstly sets the variable k to 0 and sets the bit string data signal BS to 0 (step S1).

Next, the computing device 20 determines whether the digital signal IS is 0 (step S2). If the digital signal is 0 (YES in step S2), the computing device 20 outputs the current bit string data signal BS to the output device 12 (step S5). In this case, "0000" is output as the bit string data signal BS.

On the other hand, if the digital signal IS not 0 (NO in step S2), the computing device 20 shifts the digital signal IS to the right by one bit (step S3) and increments the counter value k by one (step S4).

Thereafter, steps S2, S3, and S4 are repeated in this order as long as the digital signal IS is not 0 after the right bit shifting (NO in step S2). When the digital signal IS is 0 after the right bit shifting (YES in step S2), the computing device 20 outputs the bit string data signal BS representing that k bits are 1, in other words, that all the bits up to the k-th bit are 1 (step S5), and then ends the processing.

That is, a digital signal IS is converted into a bit string data signal BS in the manner described above.

Every time a digital signal IS is input, the signal converter 11 carries out the above conversion process to output a bit string data signal BS to the output device 12. In accordance with the inputted bit string data signal BS, the output device 12 outputs voltage signals to the individual electrode layers 4A to 4E.

Figure 9A:
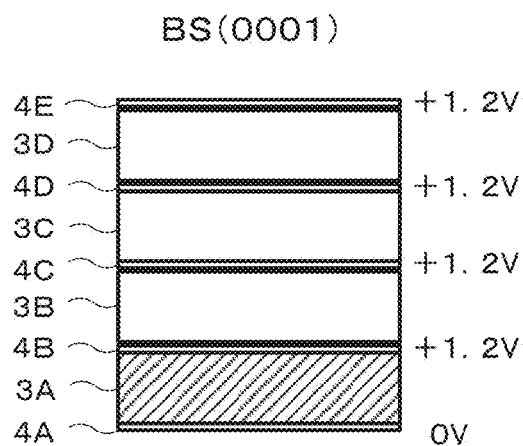
FIG. 9A is a diagram (part 1) illustrating an example of voltage signal patterns given to electrode layers.

For example, when the bit string data signal BS represents "0001" in binary form, the output device 12 outputs voltage signals to the electrode layers 4A to 4E so that the electrode layer 4A is at 0 V and the electrode layers 4B to 4E are at +1.2 V, as illustrated in FIG. 9A. As a result, only the piezoelectric layer 3A expands because only the drive voltage in the piezoelectric layer 3A is on. Conversely, to cause only the piezoelectric layer 3A to contract, voltage signals may be output to the electrode layers 4A to 4E so that the electrode layer 4A is at 0 V and the electrode layers 4B to 4E are at −1.2 V.

Figure 9B:
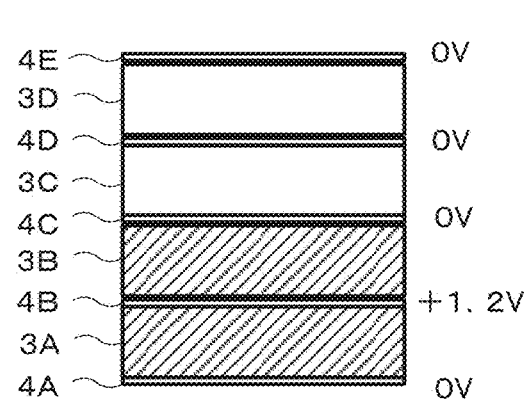
FIG. 9B is a diagram (part 2) illustrating an example of voltage signal patterns given to electrode layers.
Figure 9C:
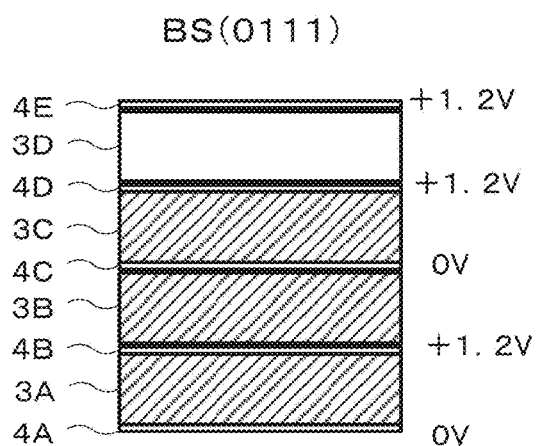
FIG. 9C is a diagram (part 3) illustrating an example of voltage signal patterns given to electrode layers.
Figure 9D:
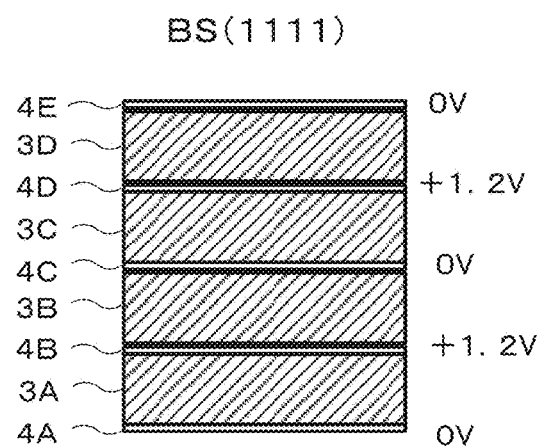
FIG. 9D is a diagram (part 4) illustrating an example of voltage signal patterns given to electrode layers.

When the bit string data signal BS represents "0011" in binary form, the output device 12 outputs voltage signals to the electrode layers 4A to 4E so that the electrode layer 4B is at +1.2 V and the electrode layers 4A, 4C, 4D, and 4E are at 0 V, as illustrated in FIG. 9B. When the bit string data signal BS represents "0111" in binary form, the output device 12 outputs voltage signals to the electrode layers 4A to 4E so that the electrode layers 4A and 4C are at 0 V and the electrode layers 4B, 4D, and 4E are at +1.2 V, as illustrated in FIG. 9C. When the bit string data signal BS represents "1111" in binary form, the output device 12 outputs voltage signals to the electrode layers 4A to 4E so that the electrode layers 4A, 4C, and 4E are at 0 V and the electrode layers 4B and 4D are at +1.2 V, as illustrated in FIG. 9D. By changing the voltage from +1.2 V to −1.2 V, the piezoelectric layers 3A to 3D each are caused to contract.

Figure 10A:
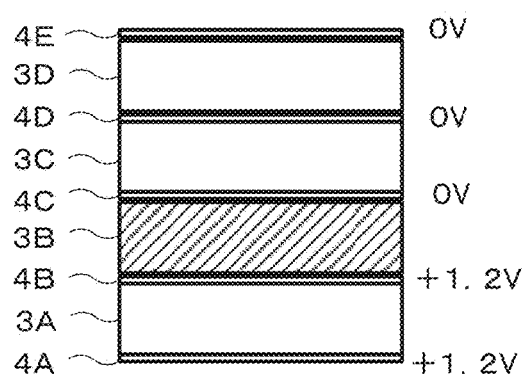
FIG. 10A is a diagram (part 1) illustrating an example of voltage signal patterns given to electrode layers for "0001" in binary form.
Figure 10B:
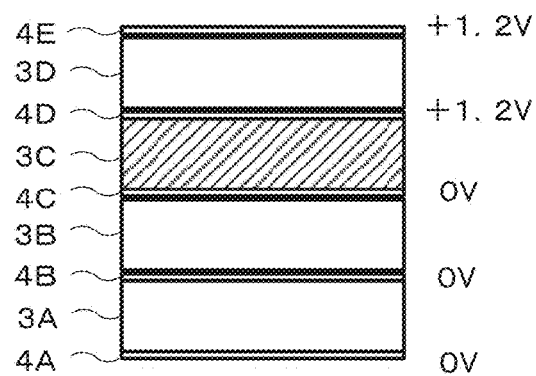
FIG. 10B is a diagram (part 2) illustrating an example of voltage signal patterns given to electrode layers for "0001" in binary form.
Figure 10C:
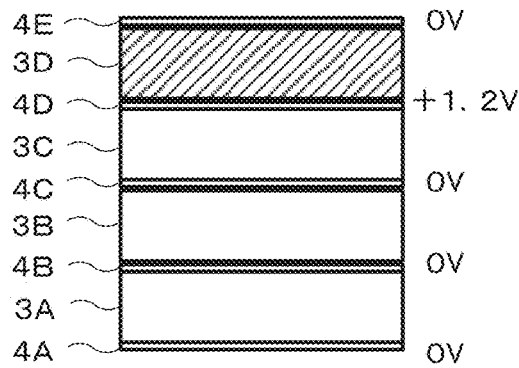
FIG. 10C is a diagram (part 3) illustrating an example of voltage signal patterns given to electrode layers for "0001" in binary form.
Figure 11A:
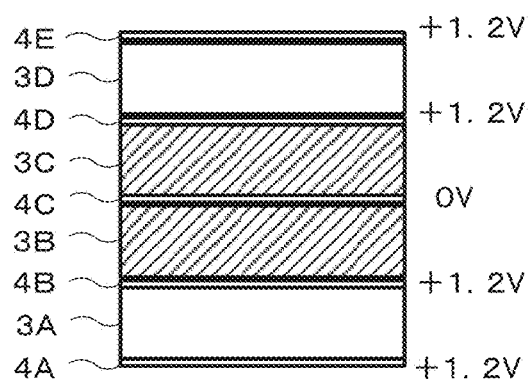
FIG. 11A is a diagram (part 1) illustrating an example of voltage signal patterns given to electrode layers for "0011" in binary form.
Figure 11B:
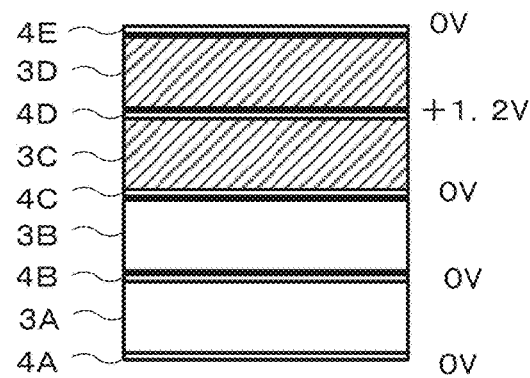
FIG. 11B is a diagram (part 2) illustrating an example of voltage signal patterns given to electrode layers for "0011" in binary form.
Figure 11C:
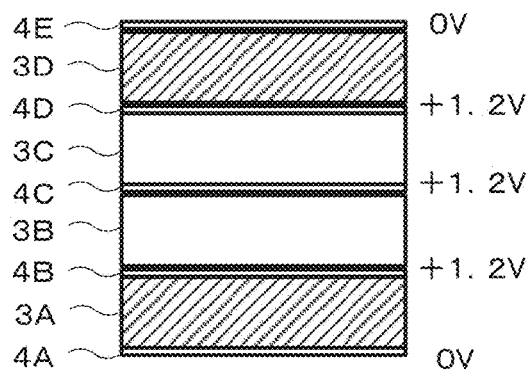
FIG. 11C is a diagram (part 3) illustrating an example of voltage signal patterns given to electrode layers for "0011" in binary form.
Figure 12A:
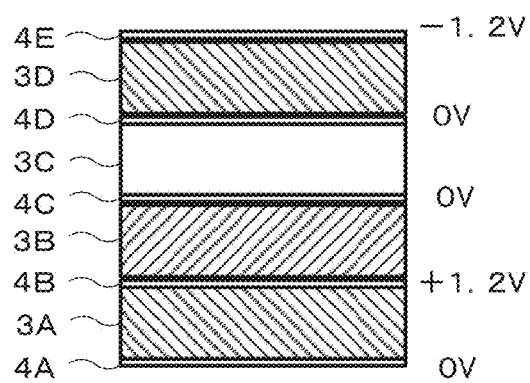
FIG. 12A is a diagram (part 1) illustrating an example of voltage signal patterns given to electrode layers for "0111" in binary form.
Figure 12B:
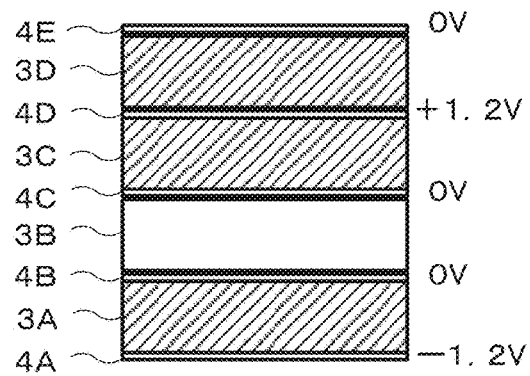
FIG. 12B is a diagram (part 2) illustrating an example of voltage signal patterns given to electrode layers for "0111" in binary form.
Figure 12C:
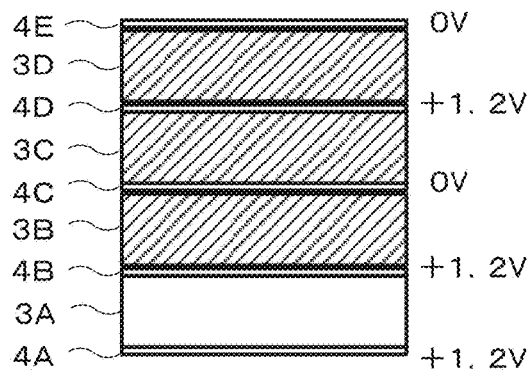
FIG. 12C is a diagram (part 3) illustrating an example of voltage signal patterns given to electrode layers for "0111" in binary form.

The imparting of voltage signals to the piezoelectric layers 3A to 3D for the bit string data signal BS representing "0001" in binary form is not limited to the configuration illustrated in FIG. 9A. For example, voltage signals may be imparted to the electrode layers 4A to 4E as illustrated in FIGS. 10A to 10C. Similarly, the imparting of voltage signals to the piezoelectric layers 3A to 3D for the bit string data signal BS representing "0011" in binary form is not limited to the configuration illustrated in FIG. 9B. For example, the voltage signals may be imparted to the electrode layers 4A to 4E as illustrated in FIGS. 11A to 11C. Similarly, the imparting of voltage signals to the piezoelectric layers 3A to 3D for the bit string data signal BS representing "0111" in binary form is not limited to the configuration illustrated in FIG. 9C. For example, the voltage signals may be imparted to the electrode layers 4A to 4E as illustrated in FIGS. 12A to 12C.

As illustrated in FIG. 1, the output device 12 includes a switching circuit 12A and a setting part 12B. The switching circuit 12A inputs the bit string data signal BS and outputs output signals to the individual electrode layers 4A to 4E. The setting part 12B sets a specific pattern of voltage signals imparted to the electrode layers 4A to 4E, such as any of the voltage patterns illustrated in FIGS. 9A to 12C. Before a digital signal IS is input, the setting part 12B can make settings about a specific bit position of data indicating the on state of a drive voltage and a specific bit position of data indicating the off state of a drive voltage, and configure the switching circuit 12A in the output device 12 with such settings in advance. By allowing bit positions to be changed in advance, a sound produced by the piezoelectric driver 10 can be fine-tuned.

As described above in detail, according to the present embodiment, the piezoelectric layers 3A to 3D, which form a stack of n layers, are bent and displaced in the direction in which the piezoelectric layers 3A to 3D are stacked, which provides a bending displacement according to the weight in decimal form of an n-bit digital signal IS, and thus a desired sound pressure can be produced. Accordingly, a sound corresponding to an n-bit digital signal can be produced without the need for placing in parallel or stacking piezoelectric layered structures, each of which is formed by stacking layers depending on the corresponding bit digit. As a result, a speaker can be achieved that has a much smaller size, lighter weight, and lower power consumption.

In addition, the present embodiment can decrease the number of stacked layers forming the piezoelectric layers 3A to 3D, resulting in reduced production cost of the speaker system 1.

Embodiment 2

Embodiment 2 of the present disclosure is described below.

Figure 13:
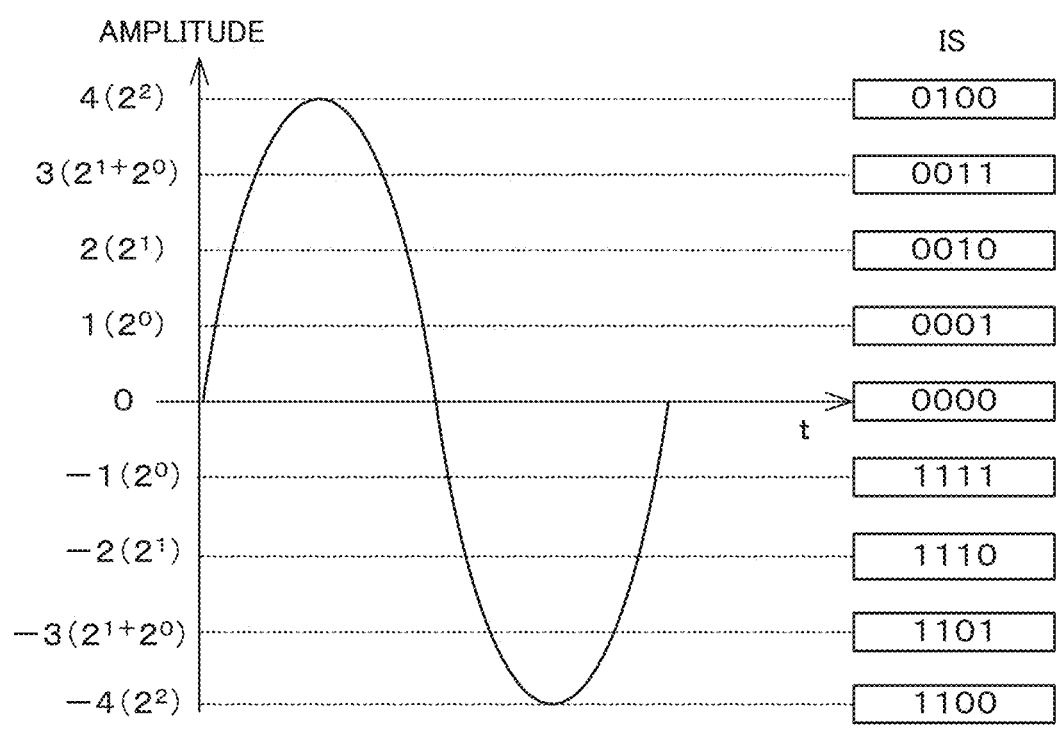
FIG. 13 is a diagram illustrating an example of input digital signals in a speaker system according to Embodiment 2 of the present disclosure.

The digital signal IS is not limited to those of Embodiment 1 described above. For example, the digital signal IS may have other bit patterns as illustrated in FIG. 13. The 4-bit digital signal IS assumes values ranging from −4 (−$2^2$) to +4 (+$2^2$). In the digital signal IS, +4 is expressed as "0100" in binary form as seen in FIG. 13. Similarly, in the digital signal IS, +3 is expressed as "0011" in binary form, +2 as "0010" in binary form, +1 as "0001" in binary form, and 0 as "0000" in binary form. A negative number represented by the digital signal IS is the two's complement of a positive number, with the uppermost bit indicating whether the number is positive or negative. In the present embodiment described below, digital signals IS having the bit patterns illustrated in FIG. 13 are input.

The speaker system 1 according to the present embodiment includes the signal converter 11 having the same hardware as illustrated in FIG. 6. The signal converter 11 converts digital signals IS having the bit patterns as shown in FIG. 13 into the bit string data signals BS as listed in FIG. 14. In accordance with the table in FIG. 14, the computing device 20 converts +4, +3, +2, +1, and 0 into "1111", "0111", "0011", "0001", and "0000" in binary form, respectively. In addition, the computing device 20 converts any other negative value into bit string data representing the two's complement of the corresponding positive number.

In other words, in the present embodiment, when the absolute value in decimal form of the digital signal IS is 0, the signal converter 11 generates a signal made up of n-bit data (n=4 in the present embodiment) indicating that drive voltages are off, as the bit string data signal BS. In addition, the signal converter 11 obtains the number m (where m is an integer satisfying 0≤m<n), which differs depending on the weight of a bit digit having a value of 1 in the absolute value in binary form of the digital signal IS. Then, the signal converter 11 generates, as the bit string data signal BS, a signal in which values of m bits indicate that a drive voltage is on and values of (n−m) bits indicate that a drive voltage is off. The weight of a bit digit is defined as follows. Assuming that, for example, the weight of the lowermost bit is 1 (=$2^0$), the weight of the second bit digit is 2 (=$2^1$) and the weights of the third and fourth bit digits are $2^2$ and $2^3$, respectively. That is, the weight of the n-th bit digit is $2^n$.

Figure 15:
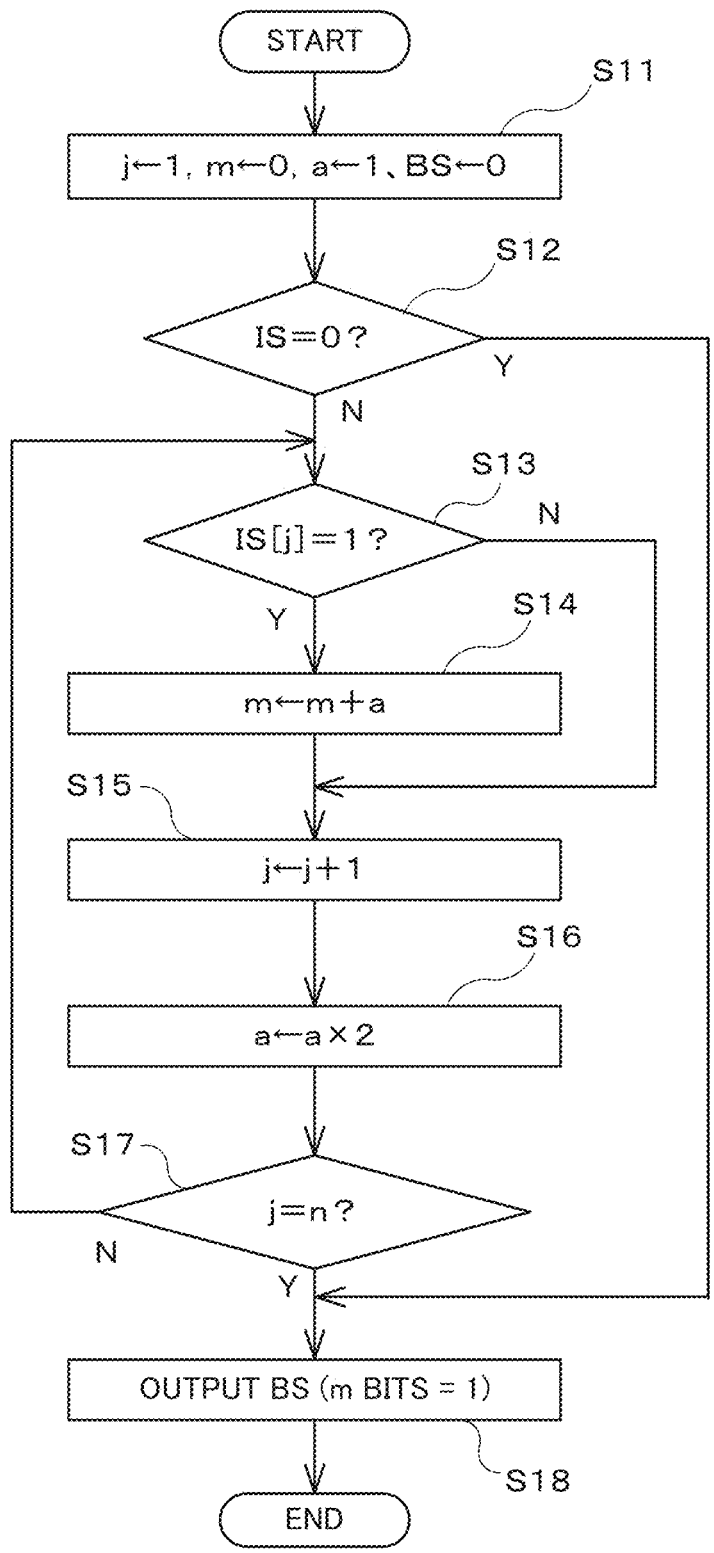
FIG. 15 is a flowchart of a signal conversion process carried out by the signal converter in the speaker system according to Embodiment 2 of the present disclosure.

The following describes operations of the signal converter 11. As shown in FIG. 15, the computing device 20 sets the counter value j to 1, the variable m to 0, the variable a to 1, and the bit string data signal BS to 0 (step S11).

Next, the computing device 20 determines whether the digital signal IS is 0 (step S12). If the digital signal is 0 (YES in step S12), the computing device 20 outputs the bit string data signal BS in which m bits out of n bits are 1 and (n−m) bits are 0 (step S18). In other words, the computing device 20 outputs the bit string data signal BS "0000" corresponding to the digital signal IS "0000".

If the digital signal IS is not 0 (NO in step S12), the computing device 20 determines whether the digital signal IS[j] is 1 (step S13), where the digital signal IS[j] is a value of the j-th digit (j is an integer satisfying 1≤j≤n) in the digital signal IS. Only when the digital signal IS[j] is 1 (YES in step S13), the computing device 20 assigns, to the variable m, a value obtained by adding the variable a to the variable m (step S14).

Next, the computing device 20 increments the counter value j by 1 (step S15), and then assigns, to the variable a, a value obtained by multiplying the variable a by 2 (step S16). Next, the computing device 20 determines whether the counter value j is equal to n (step S17). Thereafter, either steps S13, S15, S16, and S17 or steps S13, S14, S15, S16, and S17 are repeated in the order mentioned as long as the counter value j is not equal to n in step S17 (NO in step S17).

When the counter value j is equal to n (YES in step S17), the computing device 20 outputs the bit string data signal BS indicating that m bits out of n bits are 1, in other words, that all the bits up to the m-th bit are 1 (step S18).

Every time a digital signal IS is input, the signal converter 11 carries out the above conversion process to output a bit string data signal BS to the output device 12. In accordance with the inputted bit string data signal BS, the output device 12 outputs voltage signals to the individual electrode layers 4A to 4E.

The weights of individual bit digits in a digital signal IS may be, for example, $2^0$ (=1), $2^1$ (=2), $2^2$ (=4), and $2^3$ (=8) corresponding to the 1st (lowermost bit) through 4th (uppermost bit) bits for 4 bits. In this case, 15-bit string data (15=1+2+4+8) may be prepared, and the data may be output as the bit string data signal BS with a value of 1 shifted to the right by the weight of the bit digit.

Embodiment 3

Embodiment 3 of the present disclosure is described below.

Figure 16:
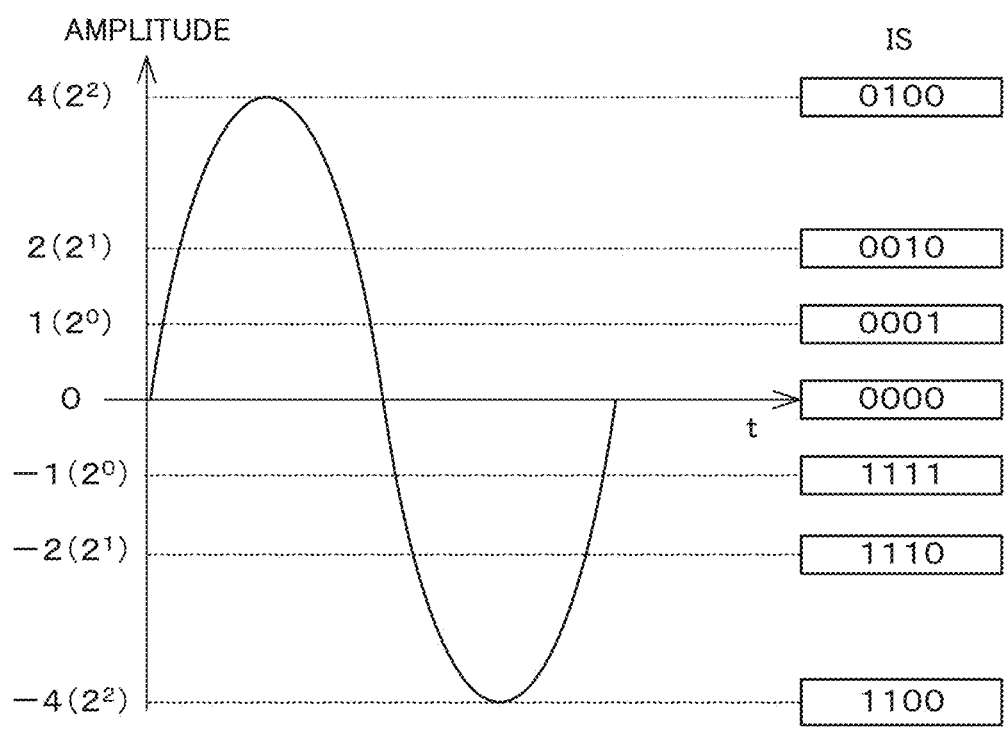
FIG. 16 is a diagram illustrating an example of input digital signals in a speaker system according to Embodiment 3 of the present disclosure.

In the present embodiment, the 4-bit digital signal IS takes values ranging from −4 ($-2^2$) to +4 ($+2^2$). In the digital signal IS, +4 is expressed as "0100" in binary form as seen in FIG. 16. Similarly, in the digital signal IS, +2 is expressed as "0010" in binary form, +1 as "0001" in binary form, and 0 as "0000" in binary form. A negative number is the two's complement of a positive number in the digital signal IS, where the uppermost bit indicates whether the number is positive or negative. In the present embodiment described below, digital signals IS having the bit patterns illustrated in FIG. 16 are input.

The speaker system 1 according to the present embodiment includes the signal converter 11 having the same hardware as illustrated in FIG. 6. The signal converter 11 converts digital signals IS having the bit patterns as shown in FIG. 16 into the bit string data signals BS as listed in FIG. 17. As shown in the table in FIG. 17, the computing device 20 converts +4, +2, +1, and 0 into "1111", "0011", "0001", and "0000" in binary form, respectively, and coverts any other negative value into bit string data representing the two's complement of the corresponding positive number.

When the absolute value in decimal form of the digital signal IS is 0, the signal converter 11 generates, as the bit string data signal BS, a signal made up of n-bit data indicating that drive voltages are off. When the absolute value in decimal form of the digital signal IS is $2^{n-2}$, the signal converter 11 generates, as the bit string data signal BS, a signal made up of n-bit data indicating that drive voltages are on.

When the absolute value in decimal form of the digital signal IS is $2^{k-1}$ (where k is an integer satisfying 1≤k<n−1), the signal converter 11 obtains the number m, which differs depending on the weight of a bit digit having a value of 1 in the absolute value in binary form of the digital signal IS. Then, the signal converter 11 generates, as the bit string data signal BS, a signal in which values of m bits indicate that a drive voltage is on and values of (n−m) bits indicate that a drive voltage is off.

Figure 18:
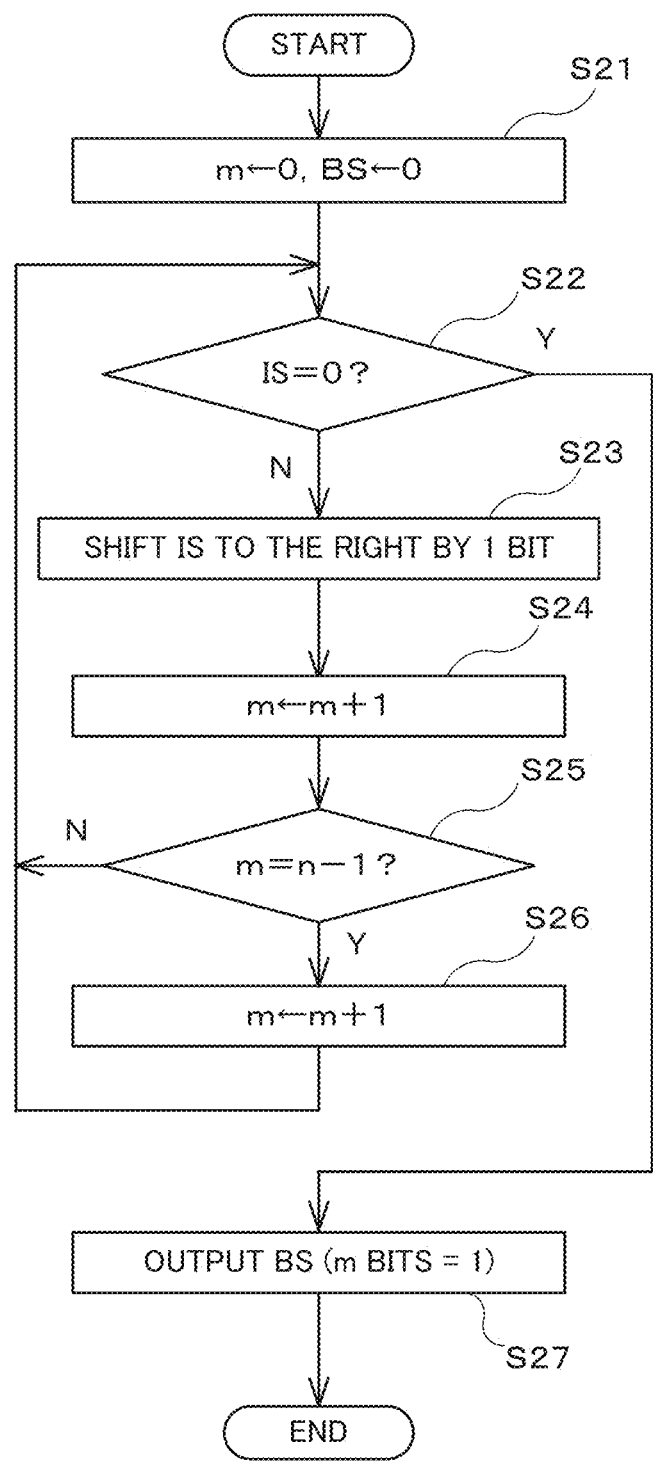
FIG. 18 is a flowchart of a signal conversion process carried out by the signal converter in the speaker system according to Embodiment 3 of the present disclosure.

Operations of the signal converter 11 in the speaker system 1 according to the present embodiment are described below. As shown in FIG. 18, the computing device 20 firstly sets the variable m to 0 and sets the bit string data signal BS to 0 (step S21).

Next, the computing device 20 determines whether the digital signal IS is 0 (step S22). If the digital signal is 0 (YES in step S22), the computing device 20 outputs the current bit string data signal BS "0000" to the output device 12 (step S27).

If the digital signal IS not 0 (NO in step S22), the computing device 20 shifts the digital signal IS to the right by one bit (step S23). Then, the computing device 20 assigns, to the variable m, a value obtained by adding 1 to the variable m (step S24), and determines whether the variable m is equal to n−1 (step S25). If the variable m is equal to n−1 (YES in step S25), that is, if the variable m is equal to n−1=3 in the present embodiment where n is 4, the computing device 20 assigns, to the variable m, a value obtained by adding 1 to the variable m (step S26). If the variable m is not equal to n−1 (NO in step S25), the computing device 20 skips step S26.

Thereafter, steps S22, S23, S24, S25, and S26 are repeated in this order as long as the digital signal IS is not 0 after the right bit shifting (NO in step S22). When the digital signal IS is 0 after the right bit shifting (YES in step S22), the computing device 20 outputs the bit string data signal BS representing that, at the present time, m bits are 1 and (n−m) bits are 0 (step S27), and then exits the process.

Thus a digital signal IS is converted into a bit string data signal BS in the manner described above.

Every time a digital signal IS is input, the signal converter 11 carries out the above conversion process to output a bit string data signal BS to the output device 12. In accordance with the inputted bit string data signal BS, the output device 12 outputs voltage signals to the individual electrode layers 4A to 4E.

Although the embodiments above employ binary bit operations for converting a digital signal IS into a bit string data signal BS, the present disclosure is not limited to such operations. A conversion table like those in FIGS. 7, 14, and 17 may be stored in the signal converter 11 in advance, and may be referred to (to find the bit string data signal BS corresponding to the outputted digital signal IS) for signal conversion. This eliminates the need for bit operations, thus further reducing the time spent on conversions.

Every time a digital signal IS is input, the signal converter 11 carries out the above conversion process to output a bit string data signal BS to the output device 12. In accordance with the inputted bit string data signal BS, the output device 12 outputs voltage signals to the individual electrode layers 4A to 4E in any of the patterns illustrated in FIGS. 9A to 12C.

Although the embodiments above employ 4-bit digital signals and 4-layer piezoelectric layers, the present disclosure is not limited to this configuration. For example, an 8-bit or 16-bit digital signal may be used. The number of bits in a digital signal and the number of piezoelectric layers in a stack may be n, where n is a natural number equal to or greater than 2.

Arithmetic operations performed in the above-described signal converter 11 are conversions from digital signals IS into bit string data signals BS with no conversion into decimal numbers, thereby achieving a shorter operation time.

Arithmetic operations in the signal converter 11 are not limited to those of the embodiments above. The bit string data signal BS may be obtained by initially setting the value of each bit in the bit string data signal BS to 1, and then shifting the bits to the right with 0 inserted in accordance with the value of the digital signal IS.

Instead of using software, arithmetic operations in the signal converter 11 may be implemented by, for example, using a special-purpose logic device (such as an application-specific integrated circuit (ASIC)), a programmable logic device (such as a simple programmable logic device (SPLD) or a complex programmable logic device (CPLD)), and a field-programmable gate array (FPGA) or the like.

Figure 19A:
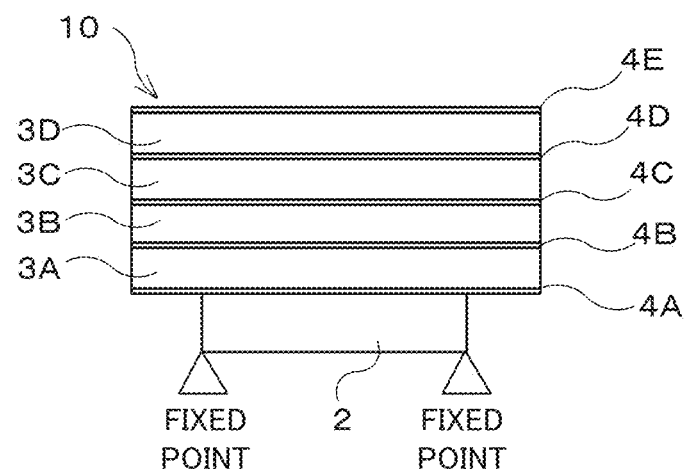
FIG. 19A is a diagram illustrating a configuration in which the piezoelectric layers are supported at two points that are inwardly offset from the ends of the piezoelectric driver.

In the embodiments described above, both ends of the individual piezoelectric layers 3A to 3D provide two-point support (securing by fixed points at both ends), with the substrate 2 stacked with the entire electrode layer 4A formed on the piezoelectric layer 3A, but this configuration is not limiting. Alternatively, the piezoelectric driver 10 may be implemented with two-point support as illustrated in FIG. 19A or one-point support as illustrated in FIG. 19C, by using a support method widely applied to what is generally called a "unimorph actuator" or "bimorph actuator", in other words, by stacking the substrate 2 with a region different from those in the above-described embodiments. The above-mentioned two-point support is a method by which the individual piezoelectric layers 3A to 3D are supported at both ends of the substrate 2 that is offset-layered. The one-point support is a method by which the individual piezoelectric layers 3A to 3D are supported at the center of the substrate 2.

Figure 19B:
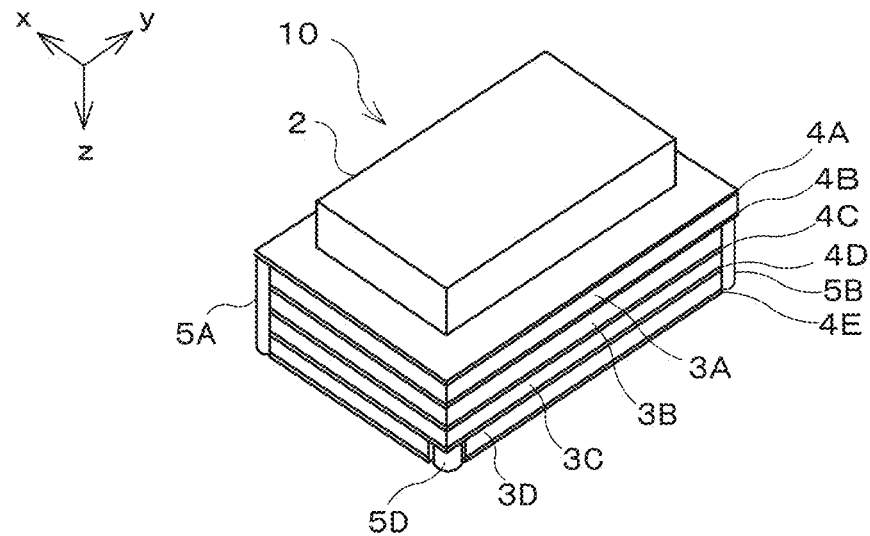
FIG. 19B illustrates the piezoelectric driver in which the substrate is layered on a region that is inwardly offset from the ends of the electrode layer.
Figure 19C:
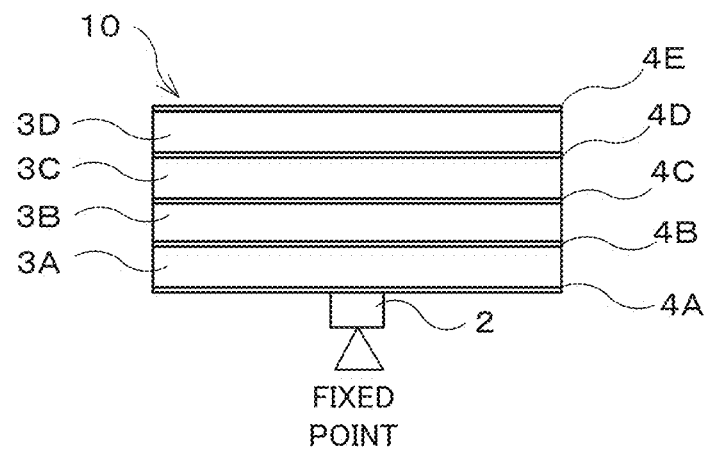
FIG. 19C is a diagram illustrating a configuration in which the piezoelectric layers are supported at a single point.
Figure 19D:
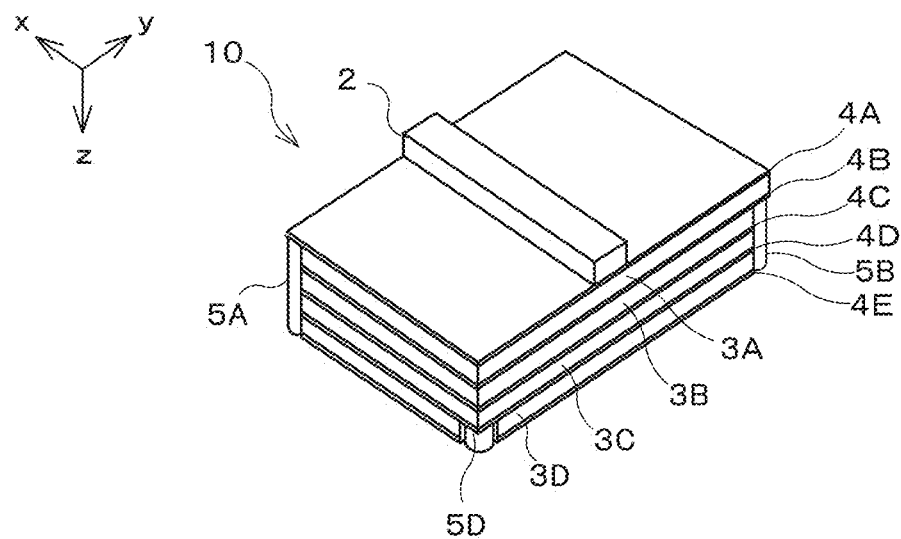
FIG. 19D illustrates the piezoelectric driver in which the substrate is layered in the middle of the electrode layer.

For example, to support the piezoelectric layers 3A to 3D at two points that are inwardly offset from the ends of the piezoelectric driver 10 as illustrated in FIG. 19A, the substrate 2 may be layered on a region that is inwardly offset from the ends of the electrode layer 4E as illustrated in FIG. 19B. To support the piezoelectric layers 3A to 3D at a single point as illustrated in FIG. 19C, the substrate 2 may be layered on, for example, a middle region of the electrode layer 4E as illustrated in FIG. 19D.

In the present embodiment, the piezoelectric layers 3A to 3D are placed so that each polarity is opposite to the polarity in an adjacent piezoelectric layer. However, this configuration is not limiting in the present disclosure. The piezoelectric layers 3A to 3D may have the same polarity, and the piezoelectric layers 3A to 3D may be driven by applying drive voltages that regularly increase or decrease stepwise, such as 0V, +1.2 V, +2.4 V, +3.6 V, and +4.8 V, to the electrode layers 4A, 4B, 4C, 4D, and 4E, respectively.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2016-82490, filed on Apr. 15, 2016, the entire disclosure of which is incorporated by reference herein.

INDUSTRIAL APPLICABILITY

The present disclosure can be applied to speakers including earphones, requiring miniaturization, and small speakers installed in a car.

REFERENCE SIGNS LIST

1 Speaker system
2 Substrate
3A, 3B, 3C, 3D Piezoelectric layer
4A, 4B, 4C, 4D, 4E Electrode layer
5A, 5B, 5C, 5D Bump
7 Rubber member
10 Piezoelectric driver
11 Signal converter
12 Output device
12A Switching circuit
12B Setting part
20 Computing device
21 Storage
22 I/O device
23 Internal bus
BS Bit string data signal
IS Digital signal

What is claimed is:
1. A speaker system comprising:
a piezoelectric driver in which electrode layers that are not grounded and n piezoelectric layers are alternately stacked layer by layer, for displacement by bending in a direction of stacking of the piezoelectric layers, n being an integer greater than or equal to 2, and electrode layers being further formed (i) underneath a lowermost piezoelectric layer of the piezoelectric layers and (ii) on top of an uppermost piezoelectric layer of the piezoelectric layers;
a signal converter for converting an n-bit digital signal into a bit string data signal of n-bits, each bit of the n bits indicating whether a drive voltage to be applied to a piezoelectric layer of the piezoelectric layers via the electrode layers is on or off; and
an output device that outputs, in accordance with values of the bits in the bit string data signal converted by the signal converter, drive voltages to be applied to each of the piezoelectric layers, wherein
when a value in decimal form of the digital signal is negative, the output device applies, to each of the piezoelectric layers, drive voltages with polarities opposite to the polarities for a positive value, and
the piezoelectric layers are arranged to have alternately opposite directions of expansion and contraction occurring when voltages are applied in a same direction.

2. The speaker system according to claim 1, wherein
when an absolute value in decimal form of the digital signal is 0, the signal converter generates, as the bit string data signal, a signal of n-bit data indicating that a drive voltage is off;
when the absolute value in decimal form of the digital signal is $2^{n-1}$, the signal converter generates, as the bit string data signal, a signal of n-bit data indicating that a drive voltage is on; and
when the absolute value in decimal form of the digital signal is $2^{k-1}$, the signal converter generates, as the bit string data signal, a signal made up of n-bit data being a combination of k-bit data indicating that a drive voltage is on and (n−k)-bit data indicating that a drive voltage is off, k being an integer satisfying $1 \le k < n$.

3. The speaker system according to claim 2, wherein
the signal converter detects any bit digit representing a value of 1 in the digital signal; and
the signal converter generates, as the bit string data signal, a signal in which a value of any bit lower than the detected bit digit indicates that a drive voltage is on and a value of any bit higher than the detected bit digit indicates that a drive voltage is off.

4. The speaker system according to claim 1, wherein
when an absolute value in decimal form of the digital signal is 0, the signal converter generates, as the bit string data signal, a signal made up of n-bit data indicating that a drive voltage is off;
when the absolute value in decimal form of the digital signal is n, the signal converter generates, as the bit string data signal, a signal made up of n-bit data indicating that a drive voltage is on; and
assuming that m represents a value obtained by cumulatively adding a weight of any bit digit having a value of 1 in the absolute value in binary form in the digital signal, the signal converter generates, as the bit string data signal, a signal made up of n-bit data being a combination of m-bit bit data indicating that a drive voltage is on and (n−m)-bit bit data indicating that a drive voltage is off, m being an integer satisfying $0 \le m < n$.

5. The speaker system according to claim 4, wherein
the signal converter obtains a number m in accordance with the weight of a bit digit having a value of 1 in the absolute value in binary form of the digital signal, and generates, as the bit string data signal, a signal in which values of m bits indicate that a drive voltage is on and values of (n−m) bits indicate that a drive voltage is off.

6. The speaker system according to claim 4, wherein
when the absolute value in decimal form of the digital signal is $2^{k-1}$, the signal converter obtains a number m in accordance with the weight of a bit digit having a value of 1 in the absolute value in binary form of the digital signal, and generates, as the bit string data signal, a signal in which values of m bits indicate that a drive voltage is on and values of (n−m) bits indicate that a drive voltage is off, k being an integer satisfying $1 \le k < n$.

7. The speaker system according to claim 1, wherein
the signal converter comprises a setting part for setting, before the digital signal is input, a position of a bit indicating that a drive voltage is on and a position of a bit indicating that a drive voltage is off in the bit string data signal.

8. The speaker system according to claim 1, wherein the piezoelectric driver is supported at a single point or two points.

* * * * *